(12) United States Patent
Chan et al.

(10) Patent No.: US 9,054,192 B1
(45) Date of Patent: Jun. 9, 2015

(54) INTEGRATION OF GE-CONTAINING FINS AND COMPOUND SEMICONDUCTOR FINS

(71) Applicant: International Business Machines Corporation, Armonk, NY (US)

(72) Inventors: Kevin K. Chan, Staten Island, NY (US); Cheng-Wei Cheng, White Plains, NY (US); Young-Hee Kim, Mohegan Lake, NY (US); Masaharu Kobayashi, Yorktown Heights, NY (US); Effendi Leobandung, Stormville, NY (US); Dae-Gyu Park, Poughquaq, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/135,662

(22) Filed: Dec. 20, 2013

(51) Int. Cl.
| H01L 29/76 | (2006.01) |
|---|---|
| H01L 27/12 | (2006.01) |
| H01L 21/336 | (2006.01) |
| H01L 29/78 | (2006.01) |
| H01L 21/84 | (2006.01) |

(52) U.S. Cl.
CPC ............ *H01L 29/785* (2013.01); *H01L 21/845* (2013.01); *H01L 27/1211* (2013.01)

(58) Field of Classification Search
CPC . H01L 29/785; H01L 29/66795; H01L 29/78; H01L 27/1211; H01L 27/0255; H01L 27/0924; H01L 21/845; H01L 21/823431; H01L 21/823821
USPC .......... 257/347, 288, 401; 438/283, 199, 157, 438/164, 151
See application file for complete search history.

(56) References Cited

U.S. PATENT DOCUMENTS

| 4,826,784 | A |  | 5/1989 | Salerno et al. |
|---|---|---|---|---|
| 4,902,643 | A |  | 2/1990 | Shimawaki |
| 7,300,837 | B2 | * | 11/2007 | Chen et al. ..................... 438/213 |
| 7,315,994 | B2 | * | 1/2008 | Aller et al. ..................... 716/106 |
| 8,264,032 | B2 |  | 9/2012 | Yeh et al. |
| 8,906,807 | B2 | * | 12/2014 | Bergendahl et al. .......... 438/696 |
| 2009/0121288 | A1 |  | 5/2009 | Patruno |
| 2011/0024794 | A1 |  | 2/2011 | Ko et al. |
| 2012/0168913 | A1 |  | 7/2012 | Toh et al. |
| 2012/0306002 | A1 |  | 12/2012 | Yeh et al. |
| 2013/0037869 | A1 |  | 2/2013 | Okano |

* cited by examiner

*Primary Examiner* — Nikolay Yushin
(74) *Attorney, Agent, or Firm* — Scully, Scott, Murphy & Presser, P.C.; Louis J. Percello, Esq.

(57) ABSTRACT

A stack of a germanium-containing layer and a dielectric cap layer is formed on an insulator layer. The stack is patterned to form germanium-containing semiconductor fins and germanium-containing mandrel structures with dielectric cap structures thereupon. A dielectric masking layer is deposited and patterned to mask the germanium-containing semiconductor fins, while physically exposing sidewalls of the germanium-containing mandrel structures. A ring-shaped compound semiconductor fin is formed around each germanium-containing mandrel structure by selective epitaxy of a compound semiconductor material. A center portion of each germanium-containing mandrel can be removed to physically expose inner sidewalls of the ring-shaped compound semiconductor fin. A high-mobility compound semiconductor layer can be formed on physically exposed surfaces of the ring-shaped compound semiconductor fin. The dielectric masking layer and fin cap dielectrics can removed to provide germanium-containing semiconductor fins and compound semiconductor fins.

20 Claims, 14 Drawing Sheets

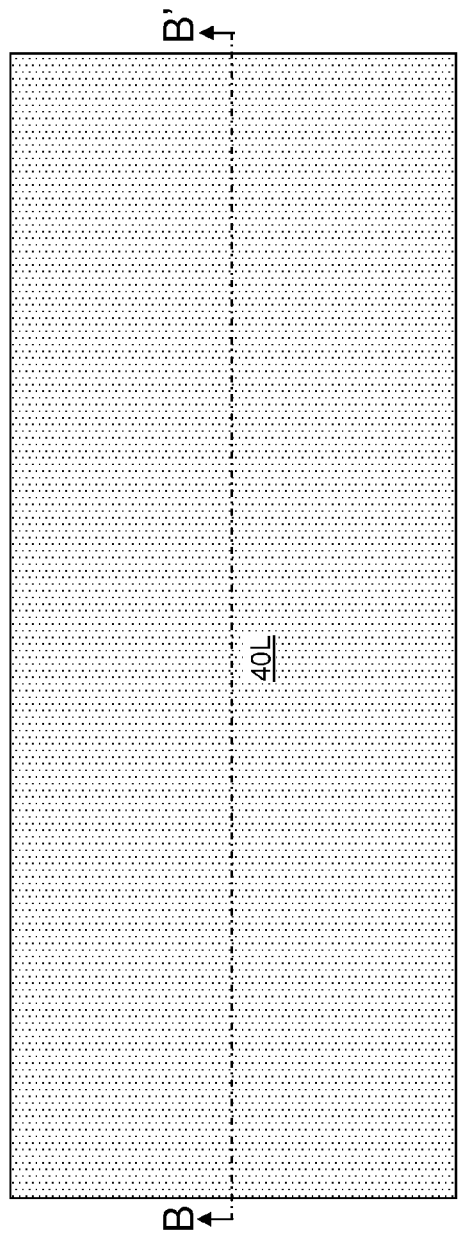
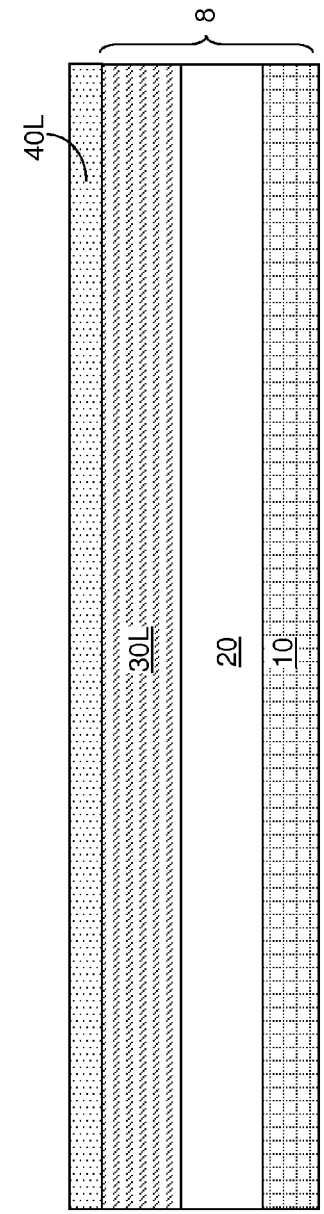
FIG. 1A
FIG. 1B

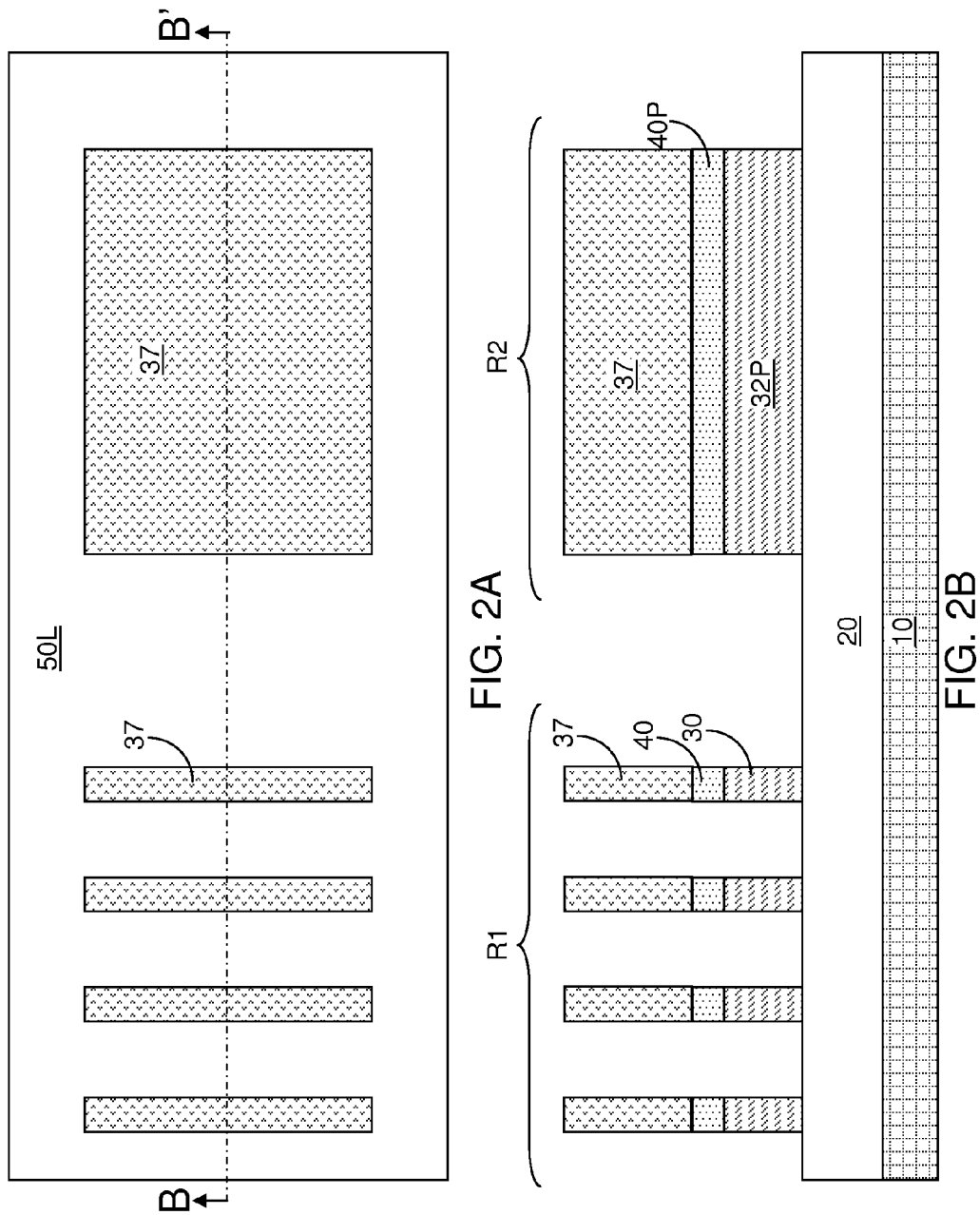

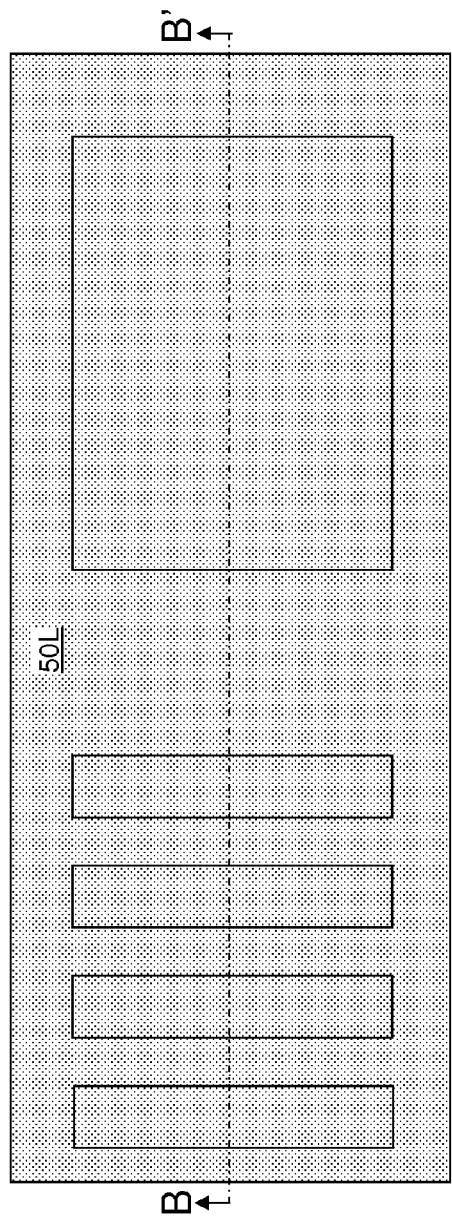
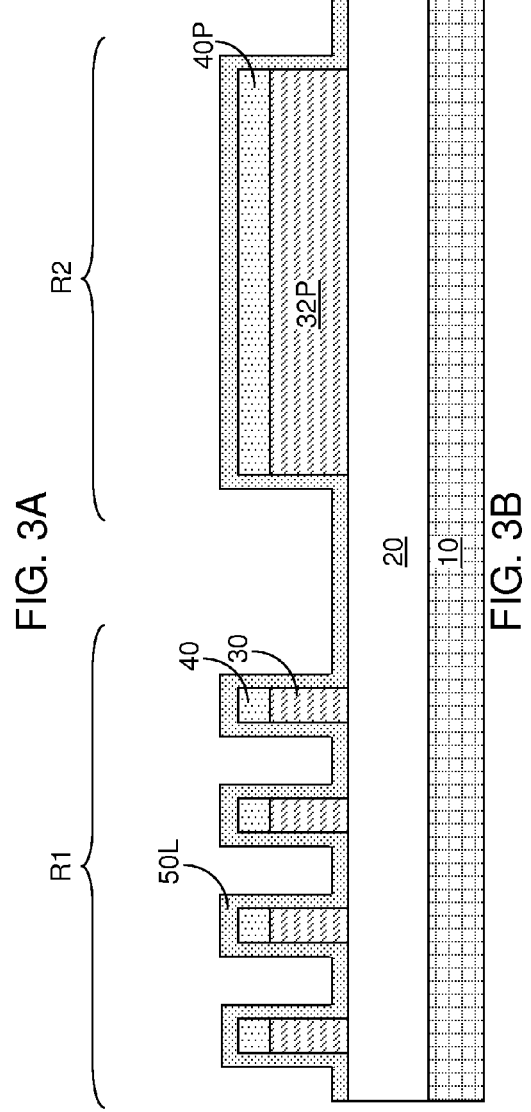
FIG. 3A
FIG. 3B

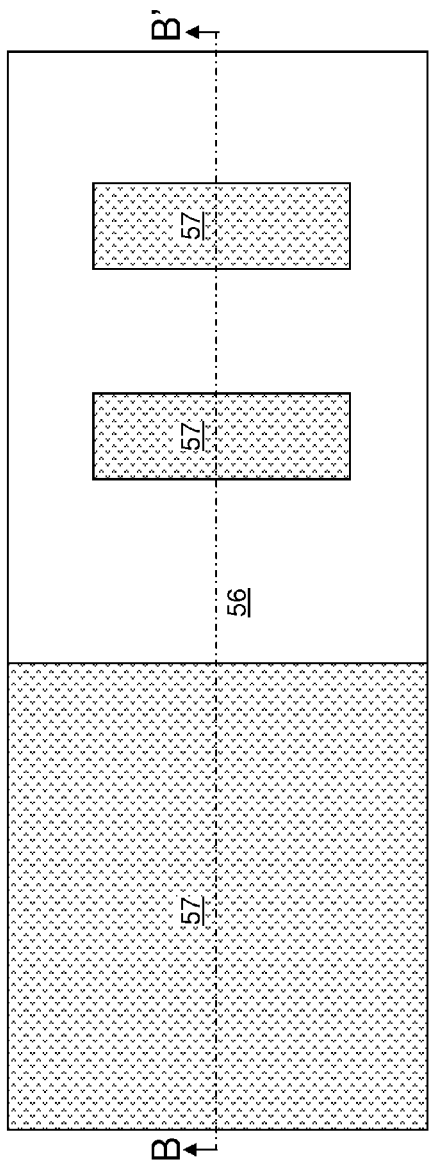
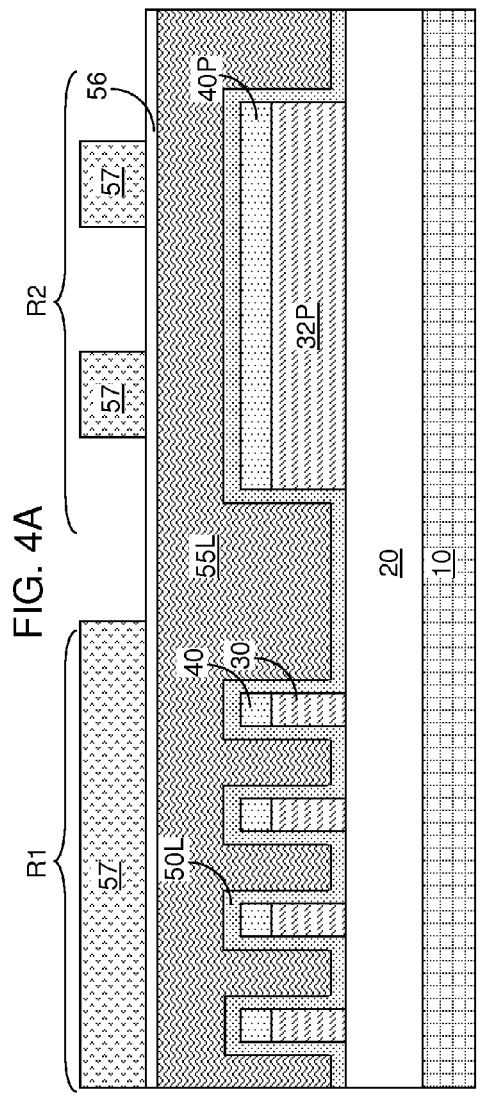
FIG. 4A
FIG. 4B

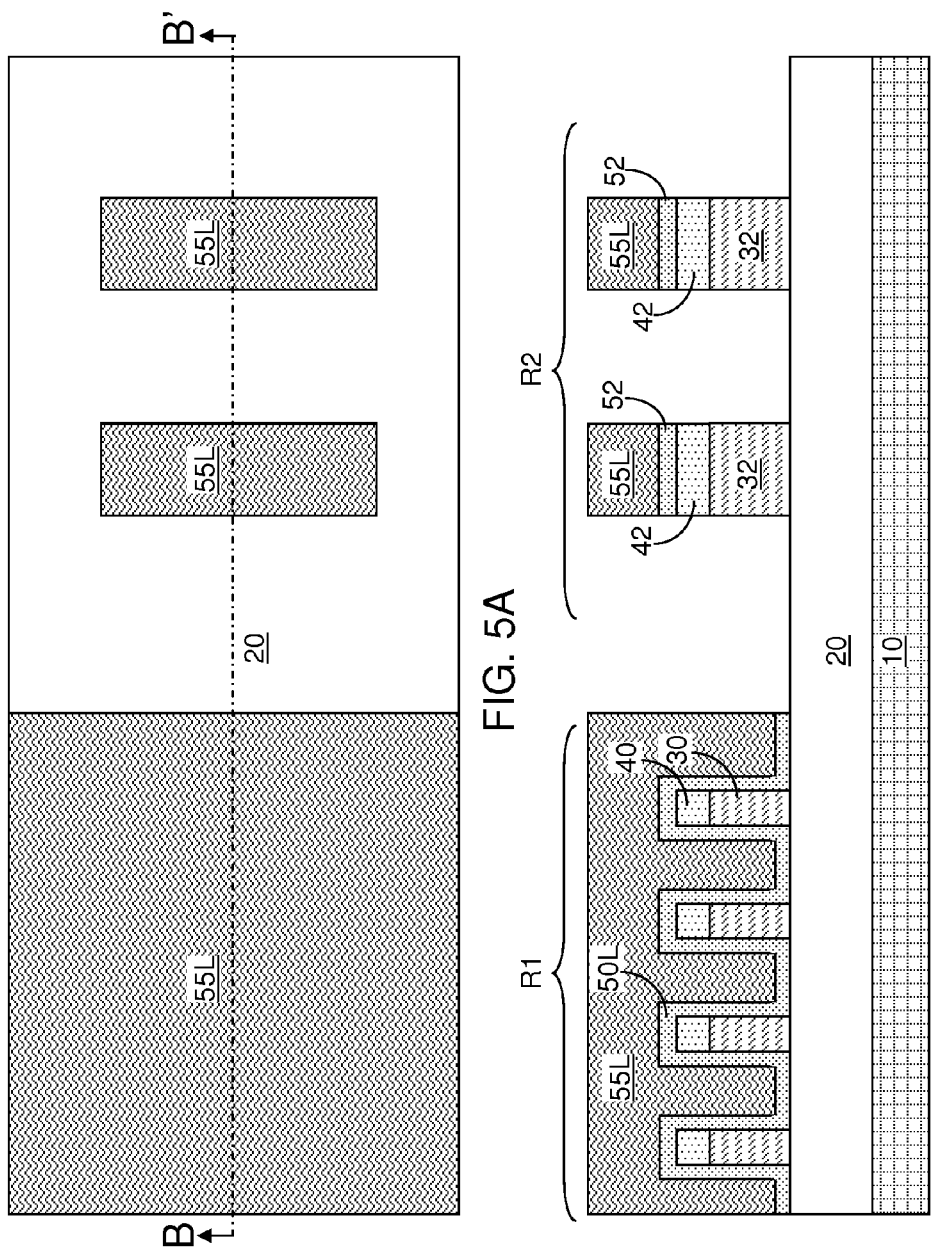

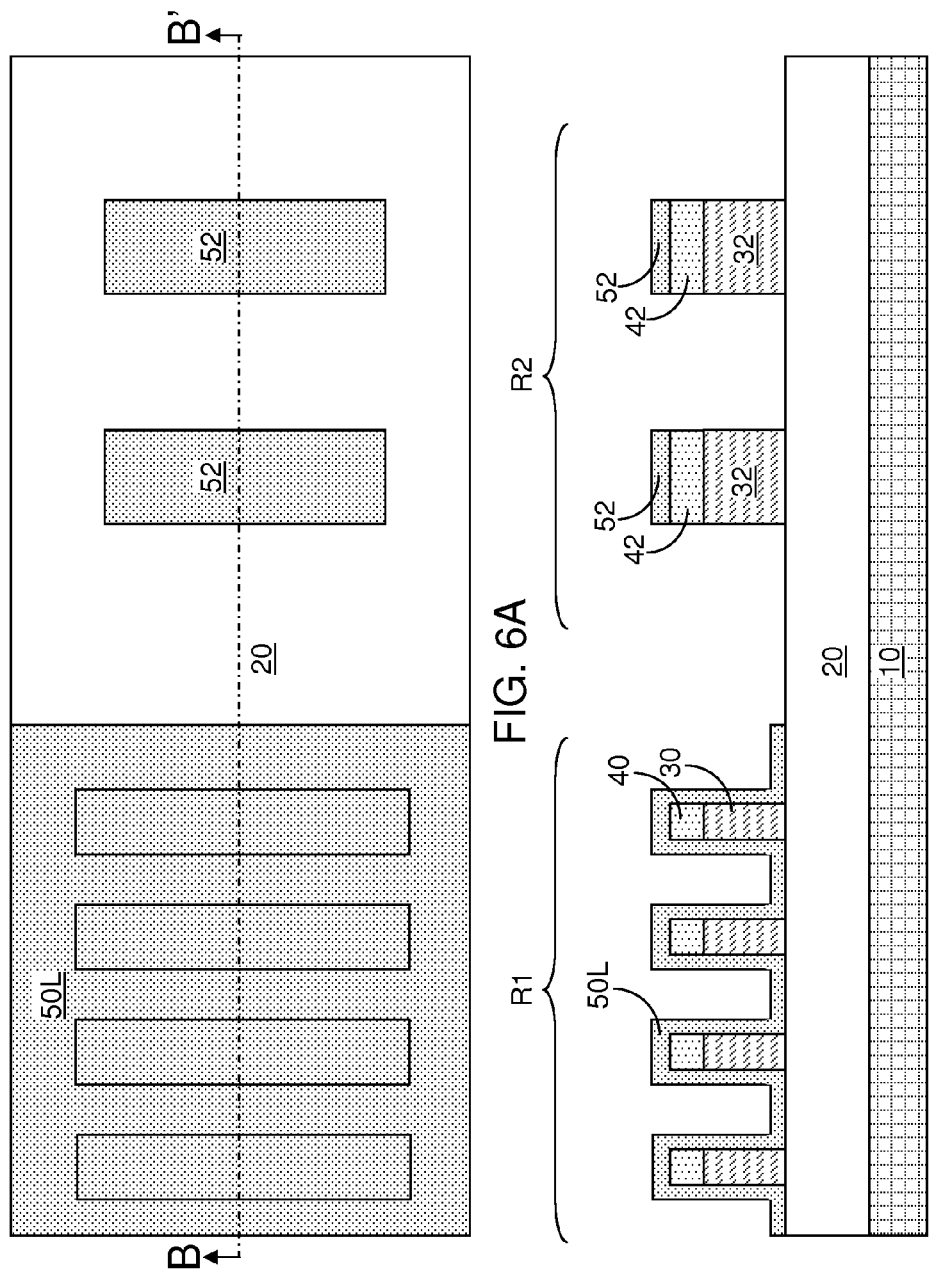

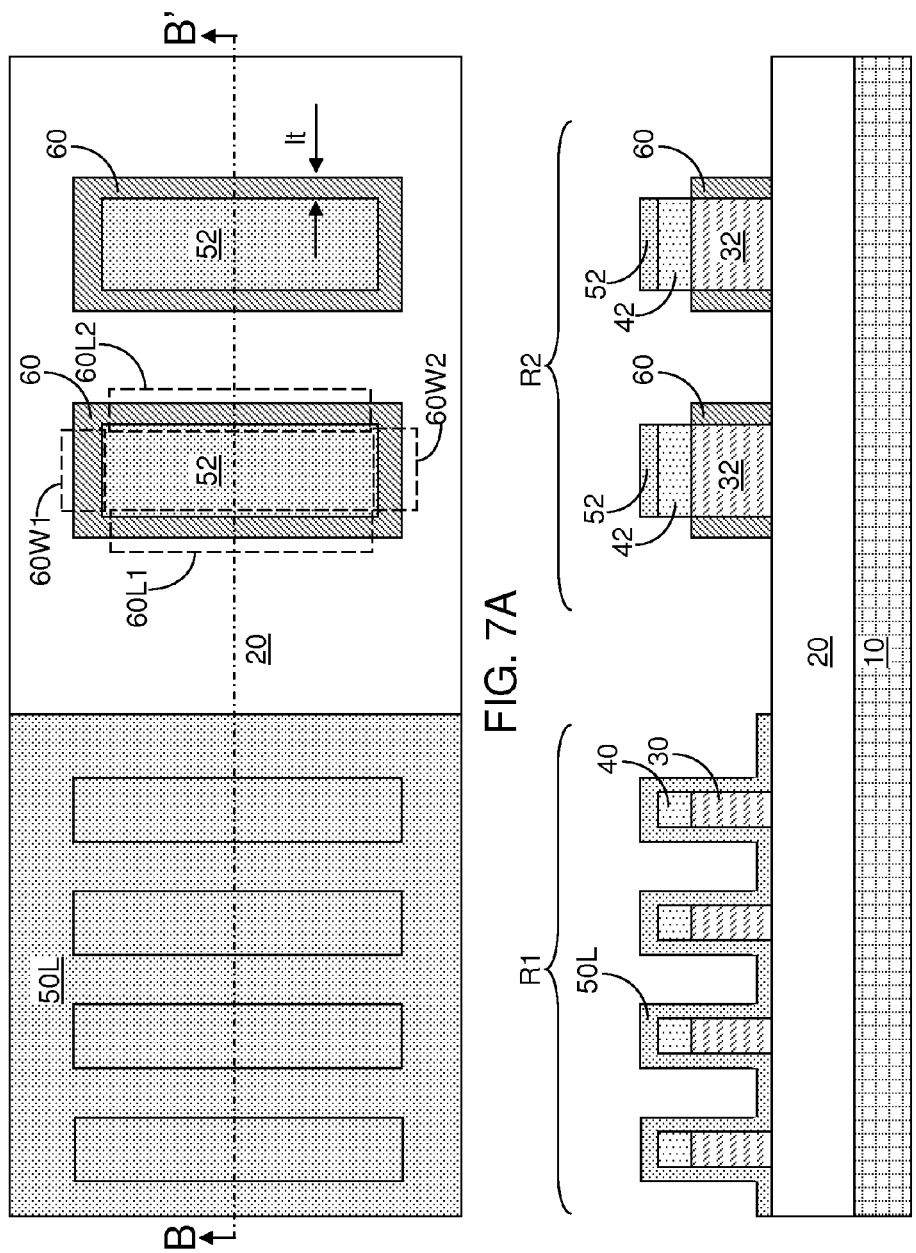

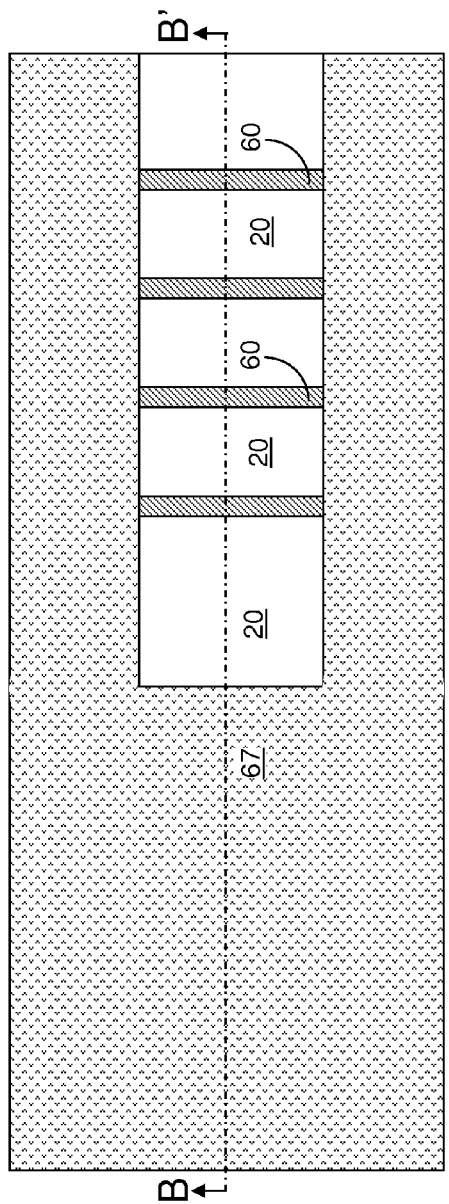
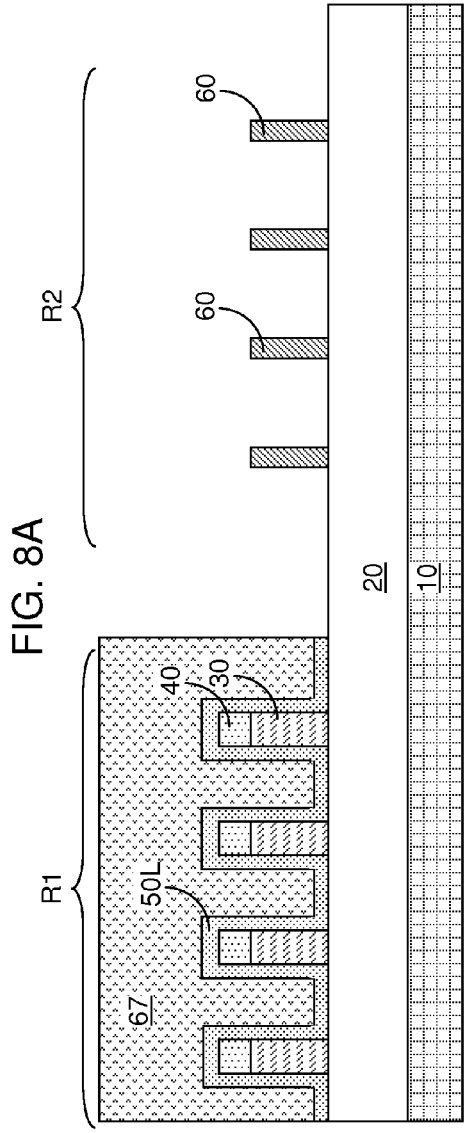
FIG. 8A
FIG. 8B

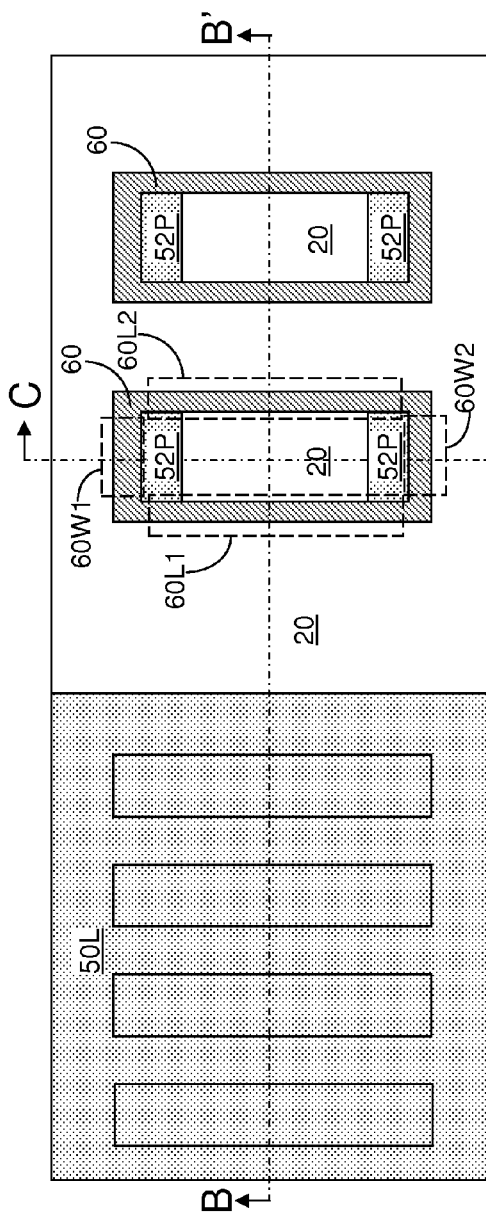
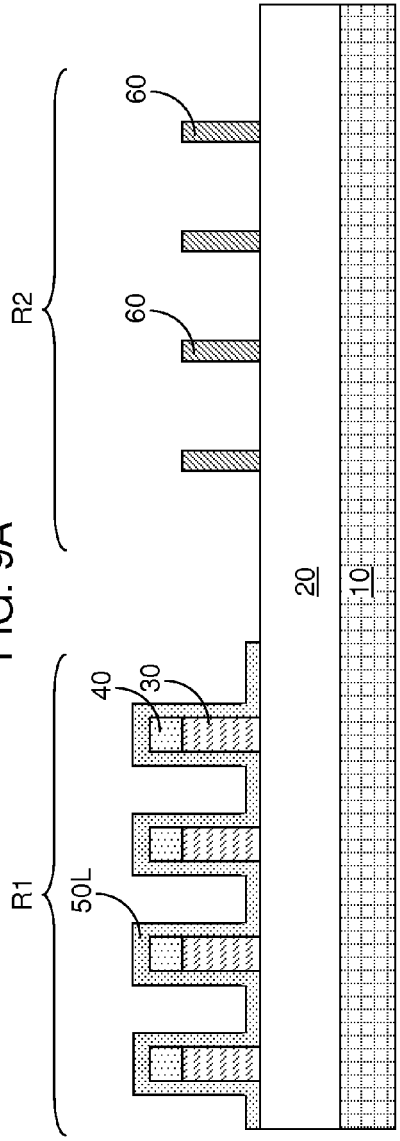
FIG. 9A
FIG. 9B

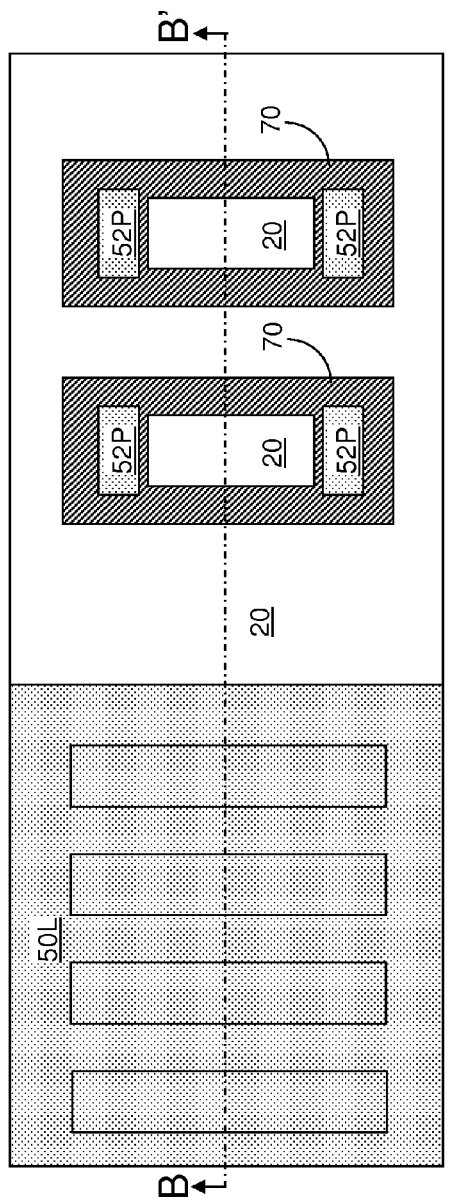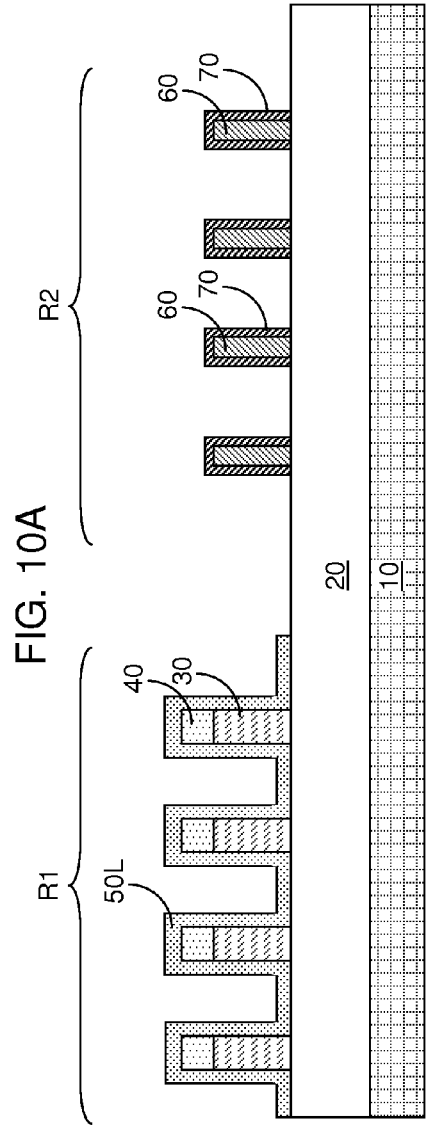
FIG. 10A
FIG. 10B

INTEGRATION OF GE-CONTAINING FINS AND COMPOUND SEMICONDUCTOR FINS

BACKGROUND

The present disclosure relates to a semiconductor structure, and particularly to a semiconductor structure including compound semiconductor fins, and a method of manufacturing the same.

A finFET is field effect transistor including a channel located in a semiconductor fin having a height that is greater than a width. FinFETs employ vertical surfaces of semiconductor fins to effectively increase a device area without increasing the physical layout area of the device. Fin-based devices are compatible with fully depleted mode operation if the lateral width of the fin is thin enough. For these reasons, fin-based devices can be employed in advanced semiconductor chips to provide high performance devices.

Germanium-containing semiconductor materials and compound semiconductor materials provide distinct advantages in different aspects of device performance. However, formation of germanium-containing semiconductor fins and compound semiconductor fins on a silicon substrate has been a challenge because of large lattice mismatches of germanium and compound semiconductor materials with respect to silicon.

SUMMARY

A stack of a germanium-containing layer and a dielectric cap layer is formed on an insulator layer. The stack is patterned to form germanium-containing semiconductor fins and germanium-containing mandrel structures with dielectric cap structures thereupon. A dielectric masking layer is deposited and patterned to mask the germanium-containing semiconductor fins, while physically exposing sidewalls of the germanium-containing mandrel structures. A ring-shaped compound semiconductor fin is formed around each germanium-containing mandrel structure by selective epitaxy of a compound semiconductor material. A center portion of each germanium-containing mandrel can be removed to physically expose inner sidewalls of the ring-shaped compound semiconductor fin. Remaining portions of the germanium-containing mandrel structures can be employed as anchor structures that provide adhesion to the insulator layer. A high-mobility compound semiconductor layer can be formed on physically exposed surfaces of the ring-shaped compound semiconductor fin. The dielectric masking layer and fin cap dielectrics can removed to provide germanium-containing semiconductor fins and compound semiconductor fins.

According to an aspect of the present disclosure, a semiconductor structure includes a ring-shaped compound semiconductor fin containing a compound semiconductor material and located on an insulator layer, and a pair of germanium-containing semiconductor material portions in contact with sidewalls of the ring-shaped compound semiconductor fin.

According to another aspect of the present disclosure, a method of forming a semiconductor structure is provided. A germanium-containing mandrel structure is formed on an insulator layer. A ring-shaped compound semiconductor fin including a compound semiconductor material around the germanium-containing mandrel structure is formed by selective epitaxy of a compound semiconductor material. A portion of the germanium-containing mandrel structure is removed. Remaining portions of the germanium-containing mandrel structure constitute a pair of germanium-containing semiconductor material portions in contact with sidewalls of the ring-shaped compound semiconductor fin.

BRIEF DESCRIPTION OF SEVERAL VIEWS OF THE DRAWINGS

FIG. 1A is a top-down view of an exemplary semiconductor structure after formation of a dielectric cap layer on a semiconductor-on-insulator (SOI) substrate including a germanium-containing semiconductor layer according to an embodiment of the present disclosure.

FIG. 1B is a vertical cross-sectional view of the exemplary semiconductor structure along the vertical plane B-B' of FIG. 1A.

FIG. 2A is a top-down view of the exemplary semiconductor structure after formation of stacks of a germanium-containing semiconductor fin and a dielectric fin cap and stacks of a germanium-containing semiconductor portion and a dielectric material portion according to an embodiment of the present disclosure.

FIG. 2B is a vertical cross-sectional view of the exemplary semiconductor structure along the vertical plane B-B' of FIG. 2A.

FIG. 3A is a top-down view of the exemplary semiconductor structure after formation of a dielectric material layer according to an embodiment of the present disclosure.

FIG. 3B is a vertical cross-sectional view of the exemplary semiconductor structure along the vertical plane B-B' of FIG. 3A.

FIG. 4A is a top-down view of the exemplary semiconductor structure after formation of an organic planarization layer (OPL), an anti-reflective coating (ARC) layer, and a photoresist layer and lithographic patterning of the photoresist layer according to an embodiment of the present disclosure.

FIG. 4B is a vertical cross-sectional view of the exemplary semiconductor structure along the vertical plane B-B' of FIG. 4A.

FIG. 5A is a top-down view of the exemplary semiconductor structure after formation of stacks of a germanium-containing mandrel structure, a first dielectric mandrel cap, and a second dielectric mandrel cap according to an embodiment of the present disclosure.

FIG. 5B is a vertical cross-sectional view of the exemplary semiconductor structure along the vertical plane B-B' of FIG. 5A.

FIG. 6A is a top-down view of the exemplary semiconductor structure after removal of the OPL according to an embodiment of the present disclosure.

FIG. 6B is a vertical cross-sectional view of the exemplary semiconductor structure along the vertical plane B-B' of FIG. 6A.

FIG. 7A is a top-down view of the exemplary semiconductor structure after formation of ring-shaped compound semiconductor fins according to an embodiment of the present disclosure.

FIG. 7B is a vertical cross-sectional view of the exemplary semiconductor structure along the vertical plane B-B' of FIG. 7A.

FIG. 8A is a top-down view of the exemplary semiconductor structure after removal of a center portion of each stack of the first dielectric mandrel cap and the second dielectric mandrel cap employing a patterned photoresist layer as an etch mask according to an embodiment of the present disclosure.

FIG. 8B is a vertical cross-sectional view of the exemplary semiconductor structure along the vertical plane B-B' of FIG. 8A.

FIG. 9A is a top-down view of the exemplary semiconductor structure after removal of a center portion of each germanium-containing mandrel structure and subsequent removal of the patterned photoresist layer according to an embodiment of the present disclosure.

FIG. 9B is a vertical cross-sectional view of the exemplary semiconductor structure along the vertical plane B-B' of FIG. 9A.

FIG. 10A is a top-down view of the exemplary semiconductor structure after formation of a high-mobility compound semiconductor layer according to an embodiment of the present disclosure.

FIG. 10B is a vertical cross-sectional view of the exemplary semiconductor structure along the vertical plane B-B' of FIG. 10A.

DETAILED DESCRIPTION

Figure 9C:
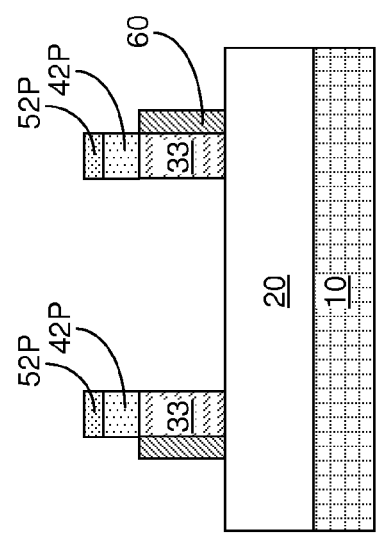
FIG. 9C is a vertical cross-sectional view of the exemplary semiconductor structure along the vertical plane C-C' of FIG. 9A.

As stated above, the present disclosure relates to a semiconductor structure including compound semiconductor fins, and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIGS. 1A and 1B, an exemplary semiconductor structure according to an embodiment of the present disclosure includes a semiconductor-on-insulator (SOI) substrate 8. The SOI substrate 8 can include a vertical stack, from bottom to top, of a handle substrate 10, an insulator 20, and a germanium-containing semiconductor layer 30L. As used herein, a "germanium-containing semiconductor" refers to a semiconductor material that includes germanium or a semiconductor alloy of germanium. As used herein, a semiconductor or a semiconductor material refers to a material that can have a resistivity in a range from $1 \times 10^{-3}$ Ohm-cm to $3 \times 10^3$ Ohm-cm upon suitable doping with a p-type dopant or an n-type dopant. Semiconductor materials include elemental semiconductor materials such as silicon and germanium, a semiconductor alloy including silicon and/or germanium, III-V compound semiconductor materials as known in the art, II-VI compound semiconductor materials as known in the art, and organic semiconductor materials as known in the art.

The handle substrate 10 can include a semiconductor material, a conductive material, and/or a dielectric material. The handle substrate 10 provides mechanical support to the buried insulator layer 20 and the germanium-containing semiconductor layer 30L. The thickness of the handle substrate 10 can be from 30 microns to 2 mm, although lesser and greater thicknesses can also be employed.

The insulator layer 20 includes an insulator material. As used herein, an insulator material refers to a material having a resistivity greater than $3 \times 10^3$ Ohm-cm. The insulator layer 20 can include a dielectric material such as silicon oxide, silicon nitride, silicon oxynitride, sapphire, or a combination thereof, or can include an intrinsic semiconductor material such as intrinsic InP or intrinsic Si. The thickness of the buried insulator layer 20 can be from 50 nm to 5 microns, although lesser and greater thicknesses can also be employed. In one embodiment, the insulator layer 20 and the handle substrate 10 can be a single contiguous structure including a same insulator material, i.e., the handle substrate 10 and the insulator layer 20 can be merged into a single insulating layer including a same insulating material.

The germanium-containing semiconductor material within the germanium-containing semiconductor layer 30L can be germanium, a silicon-germanium alloy, a germanium-carbon alloy, a silicon-germanium-carbon alloy, or a layered stack thereof. The germanium-containing semiconductor material in the germanium-containing semiconductor layer 30L can be intrinsic, p-doped, or n-doped. In one embodiment, the germanium-containing semiconductor material in the germanium-containing semiconductor layer 30L can be single crystalline. In one embodiment, the germanium-containing semiconductor material in the germanium-containing semiconductor layer 30L can be intrinsic germanium, p-doped germanium, n-doped germanium, an intrinsic silicon-germanium alloy, a p-doped silicon-germanium alloy, or an n-doped silicon-germanium alloy. The atomic concentration of germanium in the germanium-containing semiconductor layer 30L can be in a range from 10% to 100%, although lesser germanium concentrations can also be employed. The thickness of the germanium-containing semiconductor layer 30L can be in a range from 5 nm to 200 nm, although lesser and greater thicknesses can also be employed.

A dielectric cap layer 40L can be formed directly on the top surface of the germanium-containing semiconductor layer 30L. The dielectric cap layer 40L includes an amorphous dielectric material such as silicon oxide, silicon nitride, a silicon oxynitride, a dielectric metal oxide, a dielectric metal oxynitride, or a vertical stack thereof. The dielectric cap layer 40L can be formed, for example, by chemical vapor deposition (CVD) or atomic layer deposition (ALD). In one embodiment, the dielectric cap layer 40L can be a silicon nitride layer. The thickness of the dielectric cap layer 40L can be, for example, in a range from 1 nm to 30 nm, although lesser and greater thicknesses can also be employed.

Referring to FIGS. 2A and 2B, stacks of a germanium-containing semiconductor fin 30 and a dielectric fin cap 40 and a stack of a germanium-containing semiconductor portion 32P and a dielectric material portion 40P are formed by patterning the vertical stack of the germanium-containing semiconductor layer 30L (See FIG. 1B) and the dielectric cap layer 40L (See FIG. 1B). As used herein, a "semiconductor fin" refers to a contiguous structure including a semiconductor material and including at least one pair of substantially vertical sidewalls that are parallel to each other. As used herein, a surface is "substantially vertical" if there exists a vertical plane from which the surface does not deviate by more than three times the root mean square roughness of the surface. As used herein, a "dielectric fin" refers to a contiguous structure including a dielectric material and including at least one pair of substantially vertical sidewalls that are parallel to each other. As used herein, a dielectric fin cap refers to a dielectric fin that functions as a cap structure, i.e., located on top of another structure.

Patterning the vertical stack of the germanium-containing semiconductor layer 30L and the dielectric cap layer 40L can be performed, for example, by applying a photoresist layer 37 over the top surface of the dielectric cap layer 40L, lithographically patterning the photoresist layer 37, and transferring the pattern in the photoresist layer 37 into the dielectric cap layer 40L and the germanium-containing semiconductor layer 30L by an anisotropic etch such as a reactive ion etch. The remaining portions of the germanium-containing semiconductor layer 30L in a first device region R1 constitute the germanium-containing semiconductor fins 30. The remaining portions of the germanium-containing semiconductor layer 30L in a second device region R2 constitutes the germanium-containing semiconductor portion 32P. The remaining portions of the dielectric cap layer 40L in the first device region R1 constitute the dielectric fin caps 40. The remaining portion of the dielectric cap layer 40L in the second device region R2 constitutes the dielectric material portion 40P. The photoresist layer 37 can be subsequently removed, for example, by ashing.

In one embodiment, each germanium-containing semiconductor fin 30 can laterally extend along a lengthwise direction. As used herein, a lengthwise direction of a structure refers to the direction along which the moment of inertia of the structure becomes a minimum.

Referring to FIGS. 3A and 3B, a dielectric material layer 50L is formed on physically exposed surfaces of the insulator layer 20, the germanium-containing semiconductor fins 30, the dielectric fin caps 40, the germanium-containing semiconductor portion 32P, and the dielectric material portion 40P. The dielectric material layer 50L includes a dielectric material such as silicon nitride, silicon oxide, silicon oxynitride, a dielectric metal oxide, a dielectric metal oxynitride, or a combination thereof. The dielectric material layer 50L can be deposited conformally or non-conformally, provided that all sidewall surfaces of, the germanium-containing semiconductor fins 30, the dielectric fin caps 40, the germanium-containing semiconductor portion 32P, and the dielectric material portion 40P are covered by the dielectric material layer 50L. The dielectric material layer 50L can be deposited, for example, by chemical vapor deposition (CVD) or atomic layer deposition (ALD). The thickness of the horizontal portions of the dielectric material layer 50L can be in a range from 1 nm to 30 nm, although lesser and greater thicknesses can also be employed. In one embodiment, the dielectric material layer 50L can be a silicon nitride layer.

Referring to FIGS. 4A and 4B, an optional organic planarization layer (OPL) 55L, an optional anti-reflective coating (ARC) layer 56, and a photoresist layer 57 can be applied over the dielectric material layer 50L. In one embodiment, the optional OPL 55L and the optional ARC layer 56 may be omitted, and the photoresist layer 57 can be applied directly on the top surface of the dielectric material layer 50L. The OPL 55L can include any organic planarization material for a trilayer lithography process as known in the art. The ARC layer 56 can include any antireflective coating material for a trilayer lithography process as known in the art. The photoresist layer 57 is lithographically patterned to cover an entirety of the first device region R1 and to cover a subset of the area of the second device region R2. In one embodiment, the shapes of patterned portions of the photoresist layer 57 in the second device region can be rectangles having a width that is approximately the same as the target spacing between a pair of compound semiconductor fins to be subsequently formed.

Referring to FIGS. 5A and 5B, the pattern in the photoresist layer 57 is transferred through the optional ARC layer 56 (See FIG. 4B) and the optional OPL 55L (See FIG. 4B), if present, and through the dielectric material layer 50L (See FIG. 4B), the dielectric material portion 40P, and the germanium-containing semiconductor portion 32P by a series of anisotropic etch processes. Specifically, the series of anisotropic etch processes can sequentially etch portions, which are not initially masked by the patterned photoresist layer 57, of the optional ARC layer 56 (if present), the optional OPL 55L (if present), the dielectric material layer 50L, the dielectric material portion 40P, and the germanium-containing semiconductor portion 32P. In one embodiment, the photoresist layer 57 and the ARC layer 56 may be consumed during the series of anisotropic etch processes and only portions of the OPL 55L may remain at the end of the series of anisotropic etch processes. In another embodiment, portions of the photoresist layer 57 and/or portions of the ARC layer 56 may remain after the series of anisotropic etch processes.

Remaining portions of the dielectric material layer 50L, the dielectric material portion 40P, and the germanium-containing semiconductor portion 32P in the second device region R2 constitute stacks of a germanium-containing mandrel structure 32, a first dielectric fin cap 42, and a second dielectric fin 52. Each second dielectric fin 52 is a remaining portion of the dielectric material layer 50L. Each first dielectric fin 42 is a remaining portion of the dielectric material portion 40P. Each germanium-containing mandrel structure 32 is a remaining portion of the germanium-containing semiconductor portion 32P.

In one embodiment, the anisotropic etch processes that etch the material of the dielectric material portion 40P and the material of the germanium-containing semiconductor portion 32P can be selective to the material of the insulator layer 20. In this case, the top surface of the insulator layer 20 can be planar after formation of the stacks of the germanium-containing mandrel structures 32 and the at least one dielectric mandrel caps (42, 52).

Referring to FIGS. 6A and 6B, any remaining portions of the photoresist layer 57, the ARC layer 56, and the OPL 55L can be subsequently removed, for example, by ashing. Each germanium-containing mandrel structure 32 is formed on the insulator layer 20. At least one dielectric mandrel cap (42, 52) is formed over the germanium-containing mandrel structure 32. Within each stack of a germanium-containing mandrel structure 32, a first dielectric mandrel cap 42, and a second dielectric mandrel cap 52, sidewall surfaces of the germanium-containing mandrel structure 32, the first dielectric mandrel cap 42, and the second dielectric mandrel cap 52 can be vertically coincident. As used herein, two or more surfaces are vertically coincident if there exists a vertical plane that includes the two or more surfaces.

Referring to FIGS. 7A and 7B, ring-shaped compound semiconductor fins 60 are formed by selective epitaxy of a first compound semiconductor material directly on the sidewall surfaces of the germanium-containing mandrel structures 32. As used herein, a "ring-shaped" element refers to an element that is topologically homeomorphic to a torus, i.e., may be contiguously stretched into a shape of a torus without forming, or destroying a singularity. As used herein, a "compound semiconductor fin" refers to a semiconductor fin including a compound semiconductor material. Thus, a ring-shaped compound semiconductor fin 60 is a ring-shaped structure that includes a compound semiconductor material and including at least one pair of substantially vertical sidewalls that are parallel to each other.

The first compound semiconductor material in the ring-shaped compound semiconductor fins 60 can be, for example, a III-V compound semiconductor material or a II-V compound semiconductor material. In one embodiment, each germanium-containing mandrel structure 32 can include a single crystalline germanium-containing semiconductor material, and the first compound semiconductor material of each ring-shaped compound semiconductor fin 60 can be a single crystalline compound semiconductor material in epitaxial alignment with the single crystalline germanium-containing semiconductor material.

Each ring-shaped compound semiconductor fin 60 includes a pair of lengthwise semiconductor fin sections (60L1, 60L2) that are parallel to each other and extending along the lengthwise direction of a germanium-containing mandrel structure 32, and a pair of widthwise semiconductor fin sections (60W1, 60W2) that are parallel to each other and extending along a horizontal direction that is perpendicular to the direction of the germanium-containing mandrel structure 32. Each pair of lengthwise semiconductor fin sections (60L1, 60L2) include a first lengthwise semiconductor fin section 60L1 contacting a lengthwise sidewall of the germanium-containing mandrel structure 32, and a second lengthwise semiconductor fin section 60L2 contacting another lengthwise sidewall of the germanium-containing mandrel structure 32. Each pair of widthwise semiconductor fin sections (60W1, 60W2) include a first widthwise semiconductor fin section 60W1 contacting a widthwise sidewall of the germanium-containing mandrel structure 32, and a second widthwise semiconductor fin section 60W2 contacting another widthwise sidewall of the germanium-containing mandrel structure 32. Each ring-shaped compound semiconductor fin 60 is in physical contact with the insulator layer 20.

Methods of performing a selective epitaxy process are known in the art. For example, U.S. Pat. No. 4,902,643 to Shimawaki and U.S. Pat. No. 4,826,784 to Salerno et al. disclose selective epitaxy processes for depositing a compound semiconductor material. In general, compound semiconductor materials can be grown on single crystalline semiconductor surfaces provided that the crystal structures match and the lattice mismatch is less than a level that disrupts epitaxial alignment among atoms.

In one embodiment, the first compound semiconductor material of the ring-shaped compound semiconductor fins 60 can be a III-V compound semiconductor material. The first compound semiconductor material may, or may not, be doped with p-type dopants and/or n-type dopants. In one embodiment, the first compound semiconductor material can be a single crystalline III-V compound semiconductor material that contacts, and is in epitaxial alignment with, the single crystalline material of a germanium-containing mandrel structure 32. In one embodiment, the first compound semiconductor material can be single crystalline GaAs or single crystalline InGaAs.

The ring-shaped compound semiconductor fins 60 can be formed as an intrinsic semiconductor material, or can be formed with in-situ doping with p-type dopants or n-type dopants. If the ring-shaped compound semiconductor fins 60 is doped, the dopant concentration within the ring-shaped compound semiconductor fins 60 can be in a range from $1.0 \times 10^{14}/cm^3$ to $3.0 \times 10^{18}/cm^3$, although lesser and greater dopant concentrations can also be employed. The lateral thickness lt of each portion of the ring-shaped compound semiconductor fins 60 can be in a range from 3 nm to 30 nm, although lesser and greater lateral thicknesses can also be employed.

In one embodiment, the outer sidewalls of the germanium-containing mandrel structure 32 can be vertical surfaces that are crystallographic facets of the germanium-containing mandrel structure 32. In this case, the inner and outer sidewalls of the ring-shaped compound semiconductor fins 60 can be vertical crystallographic facets of the first compound semiconductor material of the ring-shaped compound semiconductor fins 60.

Referring to FIGS. 8A and 8B, a photoresist layer 67 is applied over the exemplary semiconductor structure, and is lithographically patterned to cover the first device region R1 and end portions of each assembly (32, 42, 52, 60; See FIGS. 7A and 7B) of a germanium-containing mandrel structure 32, at least one dielectric mandrel caps (42, 52), and a ring-shaped compound semiconductor fin 60. Within each assembly (32, 42, 52, 60), all of the widthwise semiconductor fin sections (60W1, 60W2), end portions of the lengthwise semiconductor fin sections (60L1, 60L2), and end portions of the at least one dielectric mandrel caps (42, 52) that are proximal to the widthwise semiconductor fin sections (60W1, 60W2) are covered by the patterned photoresist layer 67, while middle portions of the at least one dielectric mandrel caps (42, 52) and the at least one dielectric mandrel caps (42, 52) are not covered by the patterned photoresist layer 67.

The physically exposed portions of the at least one dielectric mandrel cap (42, 52) and the germanium-containing mandrel structures 32 are removed while the patterned photoresist layer 67 covers end portions of the at least one dielectric mandrel cap (42, 52). For example, an etch is performed employing the patterned photoresist layer 67 as an etch mask to remove physically exposed portions of the at least one dielectric mandrel cap (42, 52) selective to the first compound semiconductor material of the ring-shaped compound semiconductor fins 60. In one embodiment, the etch can be an anisotropic etch such as a reactive ion etch. In one embodiment, the etch may, or may not, be selective to the material of the insulator layer 20. In one embodiment, the etch is selective to the first compound semiconductor material of the ring-shaped compound semiconductor fins 60 and the material of the insulator layer 20. In one embodiment, the etch can employ a plasma of a gas selected from $CCl_2F_2$, $CHF_3$, $SiF_4$, and $SF_6$.

Subsequently, physically exposed portions of the germanium-containing mandrel structures 32 are etched by an etch that is selective to the first compound semiconductor material of the ring-shaped compound semiconductor fins 60 and the material of the insulator layer 20. The etch can be an isotropic etch or an anisotropic etch. An exemplary etch chemistry that can be employed to etch the germanium-containing material of the germanium-containing mandrel structures 32 is a combination of HF and an oxidant such as $H_2O_2$ or $O_2$.

Referring to FIGS. 9A-9C, the patterned photoresist layer 67 can be removed, for example, by ashing. Within an area enclosed by a ring-shaped compound semiconductor fin 60, remaining portions of the germanium-containing mandrel structures 32 constitute a pair of germanium-containing semiconductor material portions 33 in contact with sidewalls of the ring-shaped compound semiconductor fin 60. Remaining portions of the at least one dielectric mandrel cap (42, 52) constitute at least one dielectric cap portions (42P, 52P). The dielectric cap portions (42P, 52P) can include first dielectric cap portions 42P and second dielectric cap portions 52P. In one embodiment, a pair of stacks including, from bottom to top, a germanium-containing semiconductor material portion 33, a first dielectric cap portion 42, and a second dielectric cap portion 52 can be formed within each area enclosed by a ring-shaped compound semiconductor fin 60. Inner sidewalls of a pair of widthwise semiconductor fin sections (60W1. 60W2) and end portions of inner sidewalls of a pair of lengthwise semiconductor fin sections (60L1, 60L2) can be in contact with a pair of germanium-containing semiconductor material portions 33.

Referring to FIGS. 10A and 10B, a compound semiconductor material layer 70 including a second compound semiconductor material can be deposited on the surfaces each ring-shaped compound semiconductor fins 60 by another selective epitaxy process. The compound semiconductor material layer 70 can be a high-mobility compound semiconductor layer providing a higher mobility than the first compound semiconductor material within the ring-shaped compound semiconductor fins 60. In other words, the second compound semiconductor material of the compound semiconductor material layers 70 can have a greater electrical conductivity than the first compound semiconductor material of the ring-shaped compound semiconductor fins 60. The thickness of the compound semiconductor material layer, as measured on a sidewall of a ring-shaped compound semiconductor fins 60, a top surface of a ring-shaped compound semiconductor fins 60, or a sidewall surface of a germanium-containing semiconductor material portion 33, can be in a range from 0.5 nm to 10 nm, although lesser and greater thicknesses can also be employed.

In one embodiment, the first compound semiconductor material can be GaAs and the second compound semiconductor material can be InGaAs. In another embodiment, the first and second compound semiconductor materials can be InGaAs having different atomic ratios between In and Ga such that the second compound semiconductor material has a greater conductivity than the first compound semiconductor material.

In one embodiment, the second compound semiconductor material of each compound semiconductor material layer 70 can be in epitaxial alignment with a ring-shaped compound semiconductor fin 60 in contact with the compound semiconductor material layer 70. Further, the second compound semiconductor material can be deposited on sidewalls of a pair of germanium-containing semiconductor material portions 33 (See FIG. 9C) in contact with the ring-shaped compound semiconductor fin 60, and can be in epitaxial alignment with the germanium-containing semiconductor material in the pair of germanium-containing semiconductor material portions 33. Thus, the second compound semiconductor material of the compound semiconductor material layers 70 can be epitaxially aligned to the first compound semiconductor material and to the semiconductor material in the germanium-containing semiconductor material portions 33.

The compound semiconductor material layers 70 are not in physical contact with top surfaces of the germanium-containing semiconductor material portions 33. Each ring-shaped compound semiconductor fin 60 is encapsulated by a compound semiconductor material layer 70, a pair of germanium-containing semiconductor material portions 33, and the insulator layer 20. As used herein, an element is encapsulated by a set of elements if each and every surface of the element is in physical contact with a surface of one of the set of elements.

The germanium-containing semiconductor fins 30 are located on the insulator layer 20, and have a same composition as the germanium-containing semiconductor material portions 33. As discussed above, the germanium-containing semiconductor material portions 33 and the germanium-containing semiconductor fins 30 may include a material selected from germanium and a silicon-germanium alloy.

Figures 11A, 11B:
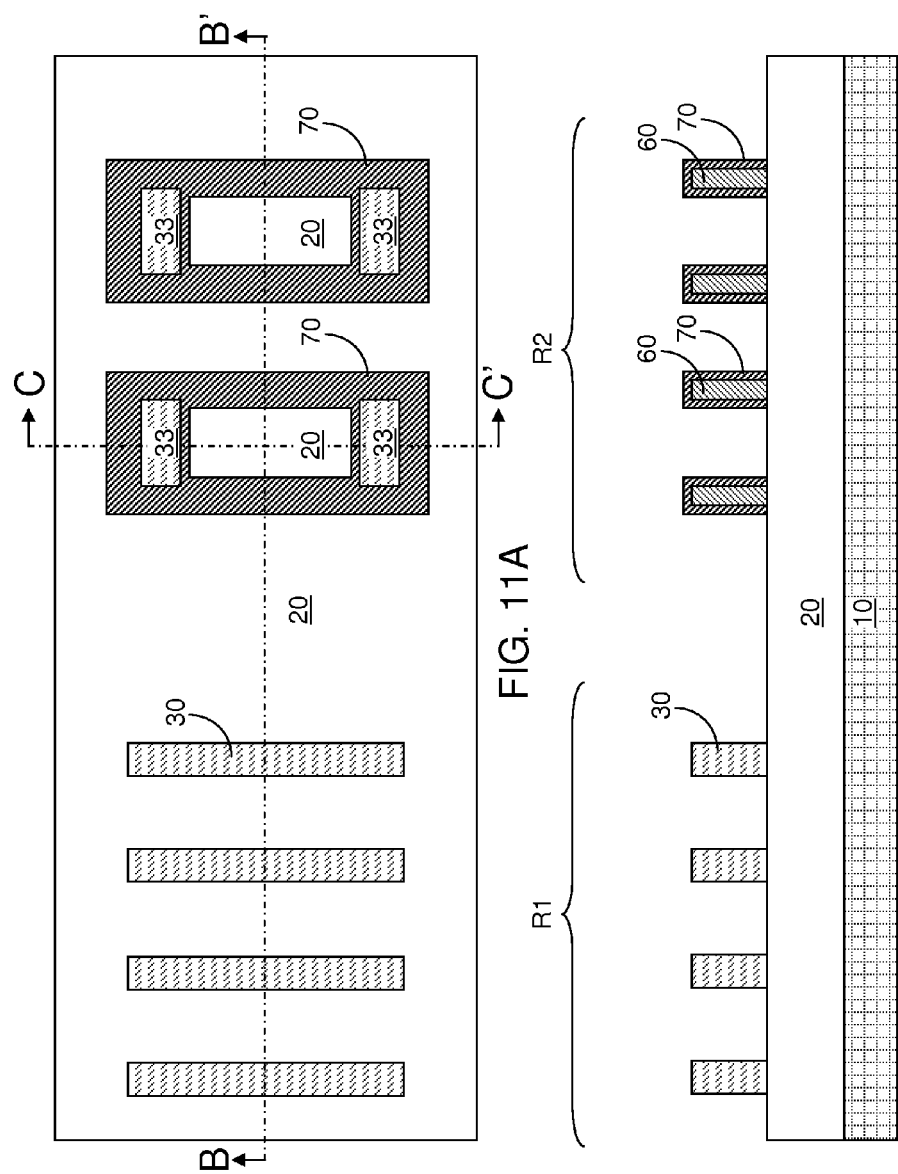
FIG. 11A is a top-down view of the exemplary semiconductor structure after removal of the dielectric material layer, the dielectric fin caps, and remaining portions of the first and second dielectric mandrel caps according to an embodiment of the present disclosure.
FIG. 11B is a vertical cross-sectional view of the exemplary semiconductor structure along the vertical plane B-B' of FIG. 11A.
Figure 11C:
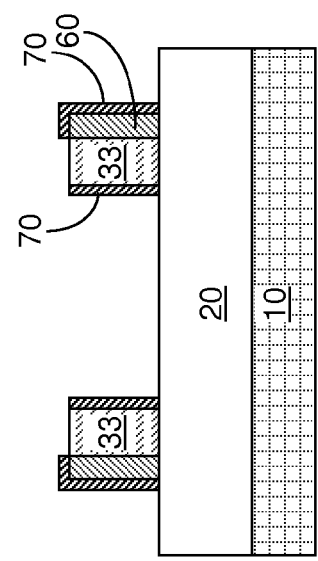
FIG. 11C is a vertical cross-sectional view of the exemplary semiconductor structure along the vertical plane C-C' of FIG. 11A.

Referring to FIGS. 11A-11C, the dielectric material layer 50L (See FIGS. 10A and 10B), the dielectric material portions 40P (See FIGS. 10A and 10B), and the dielectric cap portions (42P, 52P; See FIGS. 9A and 9C), which are remaining portions of the first and second dielectric mandrel caps (42, 52: See FIGS. 7A and 7B), are removed selective to the germanium-containing semiconductor material of the germanium-containing semiconductor fins 30 and the germanium-containing semiconductor material portions 33 and the second compound semiconductor material of the compound semiconductor material layers 70. The removal of the dielectric material layer 50L, the dielectric material portions 40P, and the dielectric cap portions (42P, 52P) can be performed by an isotropic etch such as a wet etch. For example, if the dielectric material layer 50L, the dielectric material portions 40P, and the dielectric cap portions (42P, 52P) include silicon nitride, hot phosphoric etch can be employed to remove the dielectric materials of the dielectric material layer 50L, the dielectric material portions 40P, and the dielectric cap portions (42P, 52P) selective to the semiconductor materials of the germanium-containing semiconductor fins 30, the germanium-containing semiconductor material portions 33, and the compound semiconductor material layers 70.

Figures 12A, 12B:
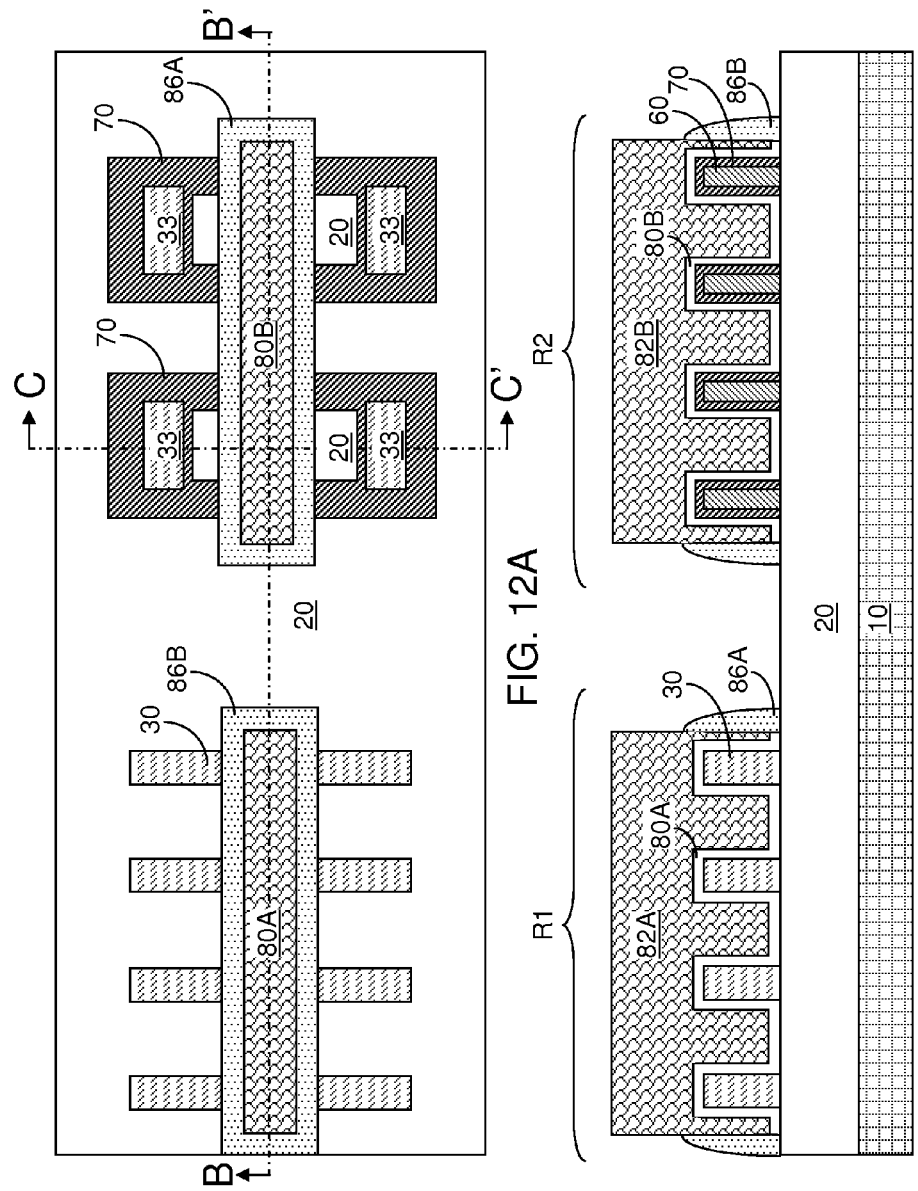
FIG. 12A is a top-down view of the exemplary semiconductor structure after formation of gate structures and gate spacers according to an embodiment of the present disclosure.
FIG. 12B is a vertical cross-sectional view of the exemplary semiconductor structure along the vertical plane B-B' of FIG. 12A.

Referring to FIGS. 12A and 12B, gate structures (80A, 80B, 82A, 82B) can be formed across the germanium-containing semiconductor fins 30 and each combination of a ring-shaped compound semiconductor fin 60 and a compound semiconductor layer 70. The gate structures (80A, 80B, 82A, 82B) can include a first gate structure (80A, 82A) that includes a first gate dielectric 80A and a first gate electrode 82A, and a second gate structure (80B, 82B) that includes a second gate dielectric 80B and a second gate electrode 82B. The first gate structure (80A, 82A) can straddle one or more of the germanium-containing semiconductor fins 30. The second gate structure (80B, 82B) can straddle one or more of the combination of a ring-shaped compound semiconductor fin 60 and a compound semiconductor layer 70. Optionally, a first gate spacer 86A can be formed around the first gate structure (80A, 82A), and a second gate spacer 86B can be formed around the second gate structure (80B, 82B). Various portions of each germanium-containing semiconductor fins 30 and each combination of a ring-shaped compound semiconductor fin 60 and a compound semiconductor layer 70 can be doped to form source regions and drain regions to form various fin field effect transistors.

The germanium-containing semiconductor material portions 33 can provide greater adhesion strength to the insulator layer 20 than the ring-shaped compound semiconductor fins 60 or the compound semiconductor layers 70. Thus, the germanium-containing semiconductor material portions 33 function as anchor structures that prevent delamination of the ring-shaped compound semiconductor fins 60 or the compound semiconductor layers 70 from the insulator layer during, and after, the processing steps of the present disclosure.

The methods of the present disclosure provide a combination of first-type fin field effect transistors containing at least one channel region that includes a germanium-containing material, and a second-type fin field effect transistor containing at least one channel region that includes a compound semiconductor material. Thus, two types of fin field effect transistors including a germanium-containing material and a compound semiconductor material, respectively, can be formed on the same substrate.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
    a ring-shaped compound semiconductor fin comprising a compound semiconductor material and located on an insulator layer; and
    a pair of germanium-containing semiconductor material portions in contact with sidewalls of said ring-shaped compound semiconductor fin.

2. The semiconductor structure of claim 1, wherein said ring-shaped compound semiconductor fin comprises:
    a pair of lengthwise semiconductor fin sections that are parallel to each other; and
    a pair of widthwise semiconductor fin sections.

3. The semiconductor structure of claim 2, wherein inner sidewalls of said pair of widthwise semiconductor fin sections and end portions of inner sidewalls of said pair of lengthwise semiconductor fin sections are in contact with said pair of germanium-containing semiconductor material portions.

4. The semiconductor structure of claim 1, further comprising a compound semiconductor material layer comprising another compound semiconductor material and in epitaxial alignment with said ring-shaped compound semiconductor fin and sidewall surfaces of said pair of germanium-containing semiconductor material portions.

5. The semiconductor structure of claim 4, wherein said compound semiconductor material layer is not in physical contact with top surfaces of said pair of germanium-containing semiconductor material portions.

6. The semiconductor structure of claim 4, wherein said another compound semiconductor material of said compound semiconductor material layer has a greater electrical conductivity than said compound semiconductor material of said ring-shaped compound semiconductor fin.

7. The semiconductor structure of claim 4, wherein said ring-shaped compound semiconductor fin is encapsulated by said compound semiconductor material layer, said pair of germanium-containing semiconductor material portions, and said insulator layer.

8. The semiconductor structure of claim 4, wherein said another compound semiconductor material of said compound semiconductor material layer is epitaxially aligned to said compound semiconductor material and to a semiconductor material in said pair of germanium-containing semiconductor material portions.

9. The semiconductor structure of claim 1, wherein said pair of germanium-containing semiconductor material portions comprises a material selected from germanium and a silicon-germanium alloy.

10. The semiconductor structure of claim 1, further comprising semiconductor fins located on said insulator layer and having a same composition as said pair of germanium-containing semiconductor material portions.

11. A method of forming a semiconductor structure comprising:
    forming a germanium-containing mandrel structure on an insulator layer;
    forming a ring-shaped compound semiconductor fin comprising a compound semiconductor material around said germanium-containing mandrel structure by selective epitaxy of a compound semiconductor material; and
    removing a portion of said germanium-containing mandrel structure, wherein remaining portions of said germanium-containing mandrel structure constitute a pair of germanium-containing semiconductor material portions in contact with sidewalls of said ring-shaped compound semiconductor fin.

12. The method of claim 11, further comprising forming a compound semiconductor material layer comprising another compound semiconductor material directly on said ring-shaped compound semiconductor fin.

13. The method of claim 12, wherein said another compound semiconductor material is in epitaxial alignment with said ring-shaped compound semiconductor fin.

14. The method of claim 12, wherein said another compound semiconductor material is deposited by a selective epitaxy process.

15. The method of claim 12, further comprising:
    forming at least one dielectric mandrel cap over said germanium-containing mandrel structure; and
    etching a physically exposed portion of said at least one dielectric mandrel cap and said portion of said germanium-containing mandrel structure while a masking layer covers end portions of said at least one dielectric mandrel cap.

16. The method of claim 12, wherein said another compound semiconductor material is deposited on sidewalls of said pair of germanium-containing semiconductor material portions.

17. The method of claim 16, wherein said another compound semiconductor material, is in epitaxial alignment with a germanium-containing semiconductor material in said pair of germanium-containing semiconductor material portions.

18. The method of claim 12, wherein said another compound semiconductor material of said compound semiconductor material layer has a greater electrical conductivity than said compound semiconductor material of said ring-shaped compound semiconductor fin.

19. The method of claim 11, wherein said pair of germanium-containing semiconductor material portions comprises a material selected from germanium and a silicon-germanium alloy.

20. The method of claim 11, further comprising forming semiconductor fins on said insulator layer, said semiconductor fins having a same composition as said germanium-containing mandrel structure.

* * * * *